(12) United States Patent
Aoyama

(10) Patent No.: US 7,644,357 B2
(45) Date of Patent: Jan. 5, 2010

(54) DATA CONVERSION SYSTEM

(75) Inventor: Kazuyuki Aoyama, Akishima (JP)

(73) Assignee: Hitachi, Ltd., Tokyo (JP)

( * ) Notice: Subject to any disclaimer, the term of this patent is extended or adjusted under 35 U.S.C. 154(b) by 117 days.

(21) Appl. No.: 10/452,166

(22) Filed: May 30, 2003

(65) Prior Publication Data

US 2004/0108943 A1   Jun. 10, 2004

(30) Foreign Application Priority Data

Dec. 6, 2002   (JP)   ............................. 2002-354495

(51) Int. Cl.
*G06F 15/00* (2006.01)
(52) U.S. Cl. .................................................. 715/249
(58) Field of Classification Search ................ 715/523, 715/249
See application file for complete search history.

(56) References Cited

U.S. PATENT DOCUMENTS

| 5,708,828 A | | 1/1998 | Coleman | |
|---|---|---|---|---|
| 6,151,608 A | * | 11/2000 | Abrams | 707/204 |
| 6,154,748 A | * | 11/2000 | Gupta et al. | 707/102 |
| 6,424,358 B1 | * | 7/2002 | DiDomizio et al. | 715/762 |
| 6,742,181 B1 | * | 5/2004 | Koike et al. | 719/317 |
| 6,978,273 B1 | * | 12/2005 | Bonneau et al. | 707/102 |

FOREIGN PATENT DOCUMENTS

| JP | A-2001-209562 | 8/2001 |
|---|---|---|
| JP | A-2003-030016 | 1/2003 |

OTHER PUBLICATIONS

Lakshmanan, et al., "SchemaSQL-An Extension to SQL for Multidatabase Interoperability", ACM Transactions on Database Systems, vol. 26, No. 4, Dec. 2001, pp. 476-519.*
U.S. Appl. No. 10/147,879, filed Mar. 6, 2003, Hitachi, Ltd.

* cited by examiner

*Primary Examiner*—Amelia Rutledge
(74) *Attorney, Agent, or Firm*—Townsend and Townsend and Crew LLP

(57) ABSTRACT

A worker defines a first conversion rule to convert data in a data format of a cooperative operation objective system as an input into data in a data format of first common data, a second conversion rule to convert data in the format of the first common data into data in a data format of a second common data, and a third conversion rule to convert data in the data format of the second common data into data in a data format of a cooperative operation objective system as an output. According to the rules, conversion processing is executed to convert data in the data format of the input system into data in the data format of the output system.

15 Claims, 15 Drawing Sheets

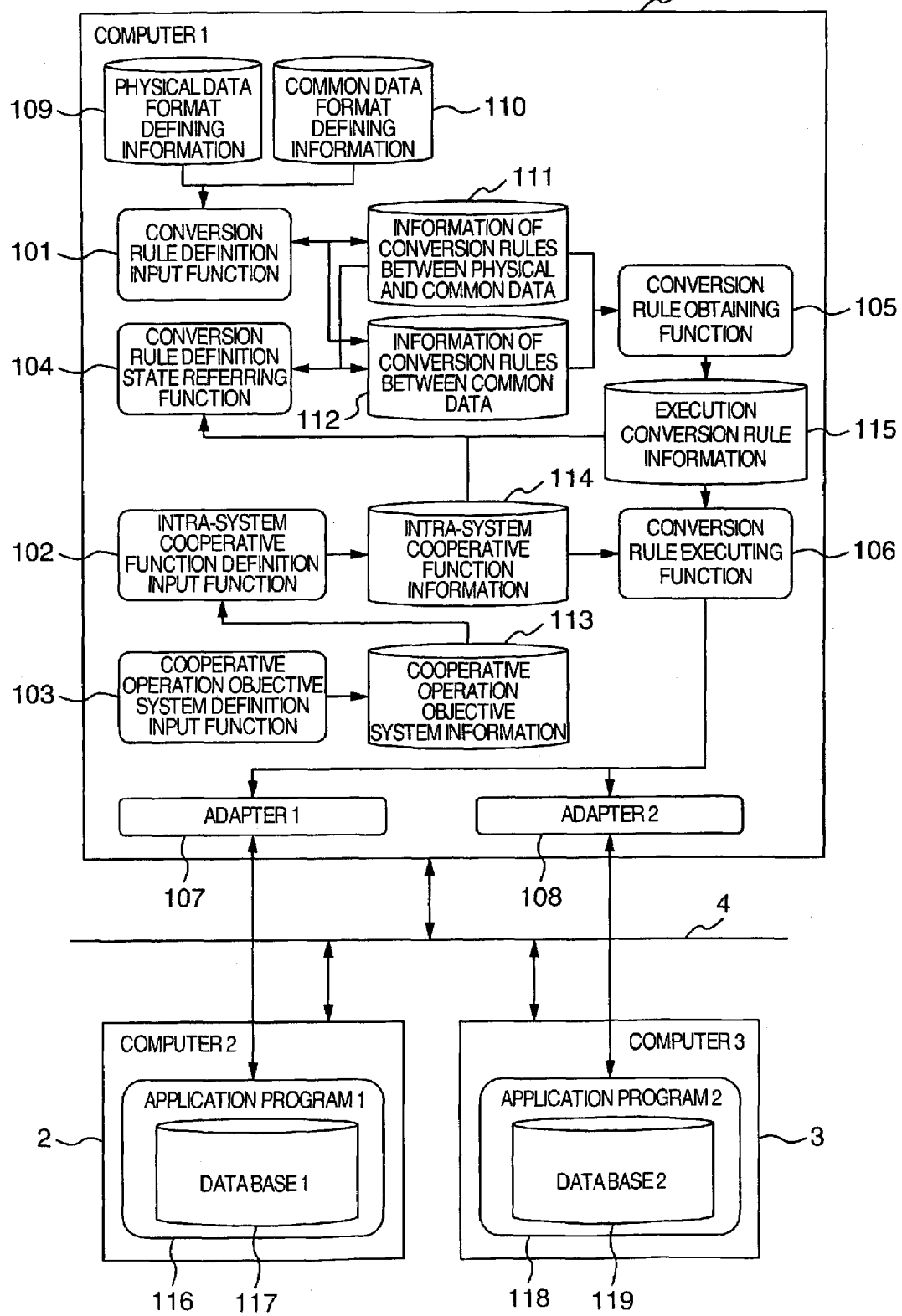

FIG.2

| PHYSICAL TABLE ID (201) | PHYSICAL TABLE NAME (202) | SYSTEM ID (203) |
|---|---|---|
| PT0101 | ORDER | APP0001 |
| PT0201 | PCHODR | APP0002 |
| PT0202 | RCVPLN | APP0002 |

204 → PT0101 row
205 → PT0201 row
206 → PT0202 row

FIG.3

| PHYSICAL DATA ITEM ID (301) | PHYSICAL DATA ITEM NAME (302) | RELATED PHYSICAL TABLE ID (303) |
|---|---|---|
| PDI010101 | ORDER_NO | PT0101 |
| PDI010102 | ORDER_PSN | PT0101 |
| PDI010103 | ORDER_SCTN | PT0101 |
| PDI010104 | ORDER_ITM | PT0101 |
| PDI010105 | ORDER_QTY | PT0101 |
| PDI010106 | ORDER_CMPNY | PT0101 |
| PDI010107 | ARRIVING_DATE | PT0101 |
| PDI010108 | ORDER_DATE | PT0101 |
| PDI020101 | PONO | PT0201 |
| PDI020102 | ITMCD | PT0201 |
| PDI020103 | QNTTY | PT0201 |
| PDI020104 | RCVDT | PT0201 |
| PDI020105 | SPPLR | PT0201 |
| PDI020106 | ISSDT | PT0201 |
| PDI020201 | INPNO | PT0202 |
| PDI020202 | ITMCD | PT0202 |
| PDI020203 | QNTTY | PT0202 |
| PDI020204 | INCDT | PT0202 |
| PDI020205 | ISSDT | PT0202 |

304: PDI010101–PDI010108
305: PDI020101–PDI020106
306: PDI020201–PDI020205

FIG.4

| COMMON TABLE ID (401) | COMMON TABLE NAME (402) |
|---|---|
| CT0001 (403) | ORDER |
| CT0002 (404) | RECEIVING PLAN |

FIG.5

| COMMON DATA ITEM ID (501) | COMMON DATA ITEM NAME (502) | RELATED COMMON TABLE ID (503) |
|---|---|---|
| CDI000101 | ORDER NO. | CT0001 |
| CDI000102 | ORDER ITEM CODE | CT0001 |
| CDI000103 | ORDER QUANTITY | CT0001 |
| CDI000104 | ORDER DESTINATION | CT0001 |
| CDI000105 | ARRIVING DATE | CT0001 |
| CDI000106 | ORDER ISSUING PERSON | CT0001 |
| CDI000107 | SECTION CODE OF ORDER ISSUANCE | CT0001 |
| CDI000108 | SLIP ISSUANCE DATE | CT0001 |
| CDI000201 | RECEIVING PLAN NO. | CT0002 |
| CDI000202 | RECEIVING PLAN ITEM CODE | CT0002 |
| CDI000203 | RECEIVING PLAN ITEM QUANTITY | CT0002 |
| CDI000204 | RECEIVING PLAN DATE | CT0002 |
| CDI000205 | SLIP ISSUANCE DATE | CT0002 |

(504: CDI000101–CDI000108; 505: CDI000201–CDI000205)

FIG.6

| PHYSICAL-COMMON TABLE CONVERSION RULE ID | PHYSICAL-COMMON TABLE CONVERSION RULE NAME | PHYSICAL TABLE ID | COMMON TABLE ID | INPUT/OUTPUT TYPE |
|---|---|---|---|---|
| PF0101 | ORDER DATA CONVERSION RULE BETWEEN AP1 AND COMMON DATA | PT0101 | CT0001 | IN |
| PF0201 | ORDER DATA CONVERSION RULE BETWEEN COMMON AND AP2 DATA | PT0201 | CT0001 | OUT |
| PF0202 | RECEIVING PLAN DATA CONVERSION RULE BETWEEN COMMON AND AP2 DATA | PT0202 | CT0002 | OUT |

| COMMON-COMMON TABLE CONVERSION RULE ID | COMMON-COMMON TABLE CONVERSION RULE NAME | INPUT COMMON TABLE ID | OUTPUT COMMON TABLE ID |
|---|---|---|---|
| CF0001 | ORDER - ORDER COMMON-COMMON DATA CONVERSION RULE | CT0001 | CT0001 |
| CF0002 | ORDER - RECEIVING PLAN COMMON-COMMON DATA CONVERSION RULE | CT0001 | CT0002 |

| PHYSICAL-COMMON DATA ITEM CONVERSION RULE ID (701) | PHYSICAL-COMMON TABLE CONVERSION RULE ID (702) | OUTPUT DATA ITEM ID (703) | INPUT DATA ITEM ID (704) |
|---|---|---|---|
| PFDI010101 | PF0101 | CDI000101 | PDI010101 |
| PFDI010102 | PF0101 | CDI000102 | PDI010104 |
| PFDI010103 | PF0101 | CDI000103 | PDI010105 |
| PFDI010104 | PF0101 | CDI000104 | PDI010106 |
| PFDI010105 | PF0101 | CDI000105 | PDI010107 |
| PFDI010106 | PF0101 | CDI000106 | PDI010102 |
| PFDI010107 | PF0101 | CDI000107 | PDI010103 |
| PFDI010108 | PF0101 | CDI000108 | PDI010108 |
| PFDI020101 | PF0201 | PDI020101 | CDI000101 |
| PFDI020102 | PF0201 | PDI020102 | CDI000102 |
| PFDI020103 | PF0201 | PDI020103 | CDI000103 |
| PFDI020104 | PF0201 | PDI020104 | CDI000105 |
| PFDI020105 | PF0201 | PDI020105 | CDI000104 |
| PFDI020106 | PF0201 | PDI020106 | CDI000108 |
| PFDI020201 | PF0202 | PDI020201 | CDI000201 |
| PFDI020202 | PF0202 | PDI020202 | CDI000202 |
| PFDI020203 | PF0202 | PDI020203 | CDI000203 |
| PFDI020204 | PF0202 | PDI020204 | CDI000204 |
| PFDI020205 | PF0202 | PDI020205 | CDI000205 |

705: rows PFDI010101–PFDI010108
706: rows PFDI020101–PFDI020106
707: rows PFDI020201–PFDI020205

FIG.9

| COMMON-COMMON DATA ITEM CONVERSION RULE ID | COMMON-COMMON TABLE CONVERSION RULE ID | OUTPUT DATA ITEM ID | INPUT DATA ITEM ID |
|---|---|---|---|
| CFDI000101 | CF0001 | CDI000101 | CDI000101 |
| CFDI000102 | CF0001 | CDI000102 | CDI000102 |
| CFDI000103 | CF0001 | CDI000103 | CDI000103 |
| CFDI000104 | CF0001 | CDI000104 | CDI000104 |
| CFDI000105 | CF0001 | CDI000105 | CDI000105 |
| CFDI000106 | CF0001 | CDI000106 | CDI000106 |
| CFDI000107 | CF0001 | CDI000107 | CDI000107 |
| CFDI000108 | CF0001 | CDI000108 | CDI000108 |
| CFDI000201 | CF0002 | CDI000201 | CDI000101 |
| CFDI000202 | CF0002 | CDI000202 | CDI000102 |
| CFDI000202 | CF0002 | CDI000203 | CDI000103 |
| CFDI000203 | CF0002 | CDI000204 | CDI000105 |
| CFDI000204 | CF0002 | CDI000205 | CDI000108 |

FIG.10

| SYSTEM ID | SYSTEM NAME | ADAPTER ID |
|---|---|---|
| APP0001 | APPLICATION PROGRAM 1 | ADP0001 |
| APP0002 | APPLICATION PROGRAM 2 | ADP0002 |

FIG.11

| INTRA-SYSTEM COOPERATIVE FUNCTION ID | INTRA-SYSTEM COOPERATIVE FUNCTION NAME | INPUT SYSTEM ID | OUTPUT SYSTEM ID | COMMON-COMMON TABLE CONVERSION RULE ID | EXECUTION CONVERSION RULE ID |
|---|---|---|---|---|---|
| F0001 | INTRA-SYSTEM COOPERATIVE FUNCTION 1 | APP0001 | APP0002 | CF0001 | |
| F0002 | INTRA-SYSTEM COOPERATIVE FUNCTION 2 | APP0001 | APP0002 | CF0002 | |

COOPERATIVE OPERATION OBJECTIVE SYSTEM DEFINITION VIEW

SYSTEM ID: APP0001 — 1201
SYSTEM NAME: APPLICATION PROGRAM 1 — 1202
ADAPTER ID: ADP0001 — 1203

1205 — CANCEL    REGISTER — 1204

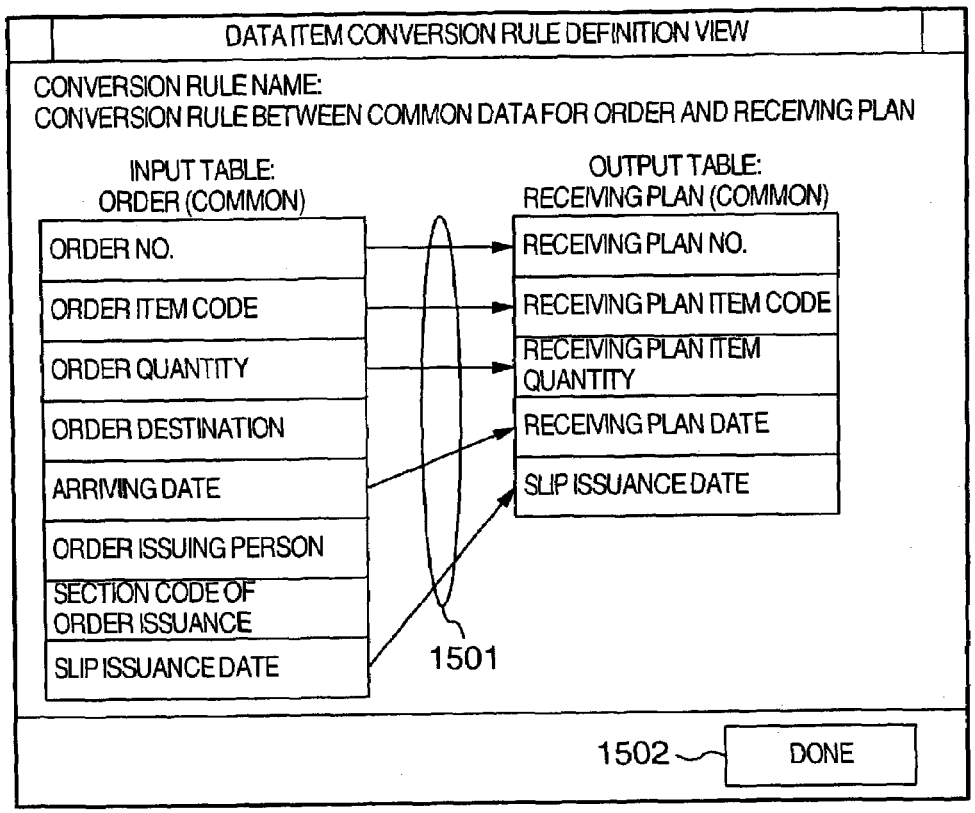

FIG. 19

VIEW TO REFER TO DATA CONVERSION RULE DEFINITION STATE BETWEEN PHYSICAL AND COMMON TABLES

| COMMON TABLE ID (1901) | INPUT/ OUTPUT TYPE (1902) | SYSTEM ID (1903) | DATA CONVERSION RULE DEFINITION STATE BETWEEN PHYSICAL AND COMMON TABLES (1904) | |
|---|---|---|---|---|
| CT0001 | IN | APP0001 | UNDEFINED | DEFINITION — 1905 |
| CT0001 | OUT | APP0002 | UNDEFINED | DEFINITION — 1906 |
| CT0002 | OUT | APP0002 | UNDEFINED | DEFINITION — 1907 |

REGISTER

FIG. 20

CONVERSION RULE DEFINITION VIEW

- CONVERSION RULE ID: PF0101 — 2001
- CONVERSION RULE NAME: ORDER DATA CONVERSION RULE BETWEEN AP1 AND COMMON DATA — 2002
- CONVERSION RULE TYPE: PHYSICAL → COMMON ● (2003)  COMMON → COMMON ○  COMMON → PHYSICAL ○ (2004)
- INPUT TABLE ID: PT0101 ▼ — 2005
- OUTPUT TABLE ID: CT0001 ▼ — 2006

OK

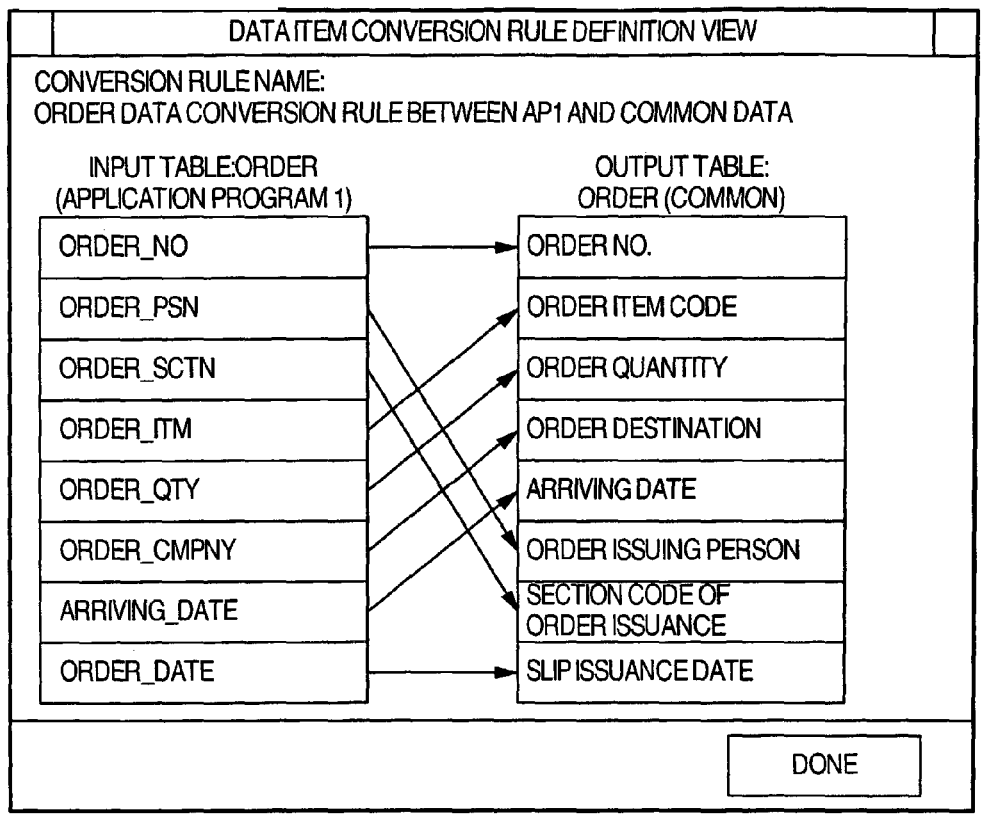

| EXECUTION CONVERSION RULE ID | INPUT PHYSICAL TABLE ID | OUTPUT PHYSICAL TABLE ID |
|---|---|---|
| XF0001 | PT0101 | PT0201 |
| XF0002 | PT0101 | PT0202 |

2601 — EXECUTION CONVERSION RULE ID
2602 — INPUT PHYSICAL TABLE ID
2603 — OUTPUT PHYSICAL TABLE ID
2604 — XF0001 row
2605 — XF0002 row

FIG.27

| ID OF CONVERSION RULE BETWEEN PHYSICAL DATA ITEMS (2701) | EXECUTION CONVERSION RULE ID (2702) | OUTPUT PHYSICAL DATA ITEM ID (2703) | INPUT PHYSICAL DATA ITEM ID (2704) |
|---|---|---|---|
| XFDI000101 | XF0001 | PDI020101 | PDI010101 |
| XFDI000102 | XF0001 | PDI020102 | PDI010104 |
| XFDI000103 | XF0001 | PDI020103 | PDI010105 |
| XFDI000104 | XF0001 | PDI020104 | PDI010107 |
| XFDI000105 | XF0001 | PDI020105 | PDI010106 |
| XFDI000106 | XF0001 | PDI020106 | PDI010108 |
| XFDI000201 | XF0002 | PDI020201 | PDI010101 |
| XFDI000202 | XF0002 | PDI020202 | PDI010104 |
| XFDI000203 | XF0002 | PDI020203 | PDI010105 |
| XFDI000204 | XF0002 | PDI020204 | PDI010107 |
| XFDI000205 | XF0002 | PDI020205 | PDI010108 |

2705: rows XFDI000101–XFDI000106
2706: rows XFDI000201–XFDI000205

DATA CONVERSION SYSTEM

BACKGROUND OF THE INVENTION

The present invention relates to a plurality of systems using data items in mutually different data formats and a technique to cooperatively operate the systems, and in particular, to a technique to obtain a conversion rule to convert data between different data formats.

Recently, attention has been attracted to a technique to construct a complex system at a low cost in a short period of time to provide a new business function by cooperatively operating existing systems of different types (systems using data items of different data formats or the respective systems).

Data formats such as data layouts, data types, and code systems are different from each other in the systems of different types. Therefore, to communicate data between the systems of different types, it is essential to conduct data format conversion between the systems.

To execute the conversion, U.S. Pat. No. 5,708,828 (hereinafter referred to as "Patent Document 1") describes a technique to execute conversion processing using intermediate data in a data format which is an intermediate format between a plurality of systems. That is, Patent Document 1 describes a technique in which data is converted from a data format of a conversion source into an intermediate data format and then the data is converted from the intermediate data format into a data format of a conversion destination.

SUMMARY OF THE INVENTION

According to Patent Document 1, a problem occurs when the conversion is conducted between data items which are different in meaning from each other but correspond to each other. Patent Document 1 processes source data and destination data which are different in the data format but are equal in meaning to each other. For example, when a first system processes order slip data, a second system also processes order slip data.

However, there exists a case in which these systems process data items different in meaning from each other. For example, when a first system processes data of order slip, a second system processes data of an order receiving slip according to the order. When the systems process data items which correspond to each other but are different in the meaning from each other as above, it is required according to Patent Document 1 to manually relate the corresponding data items to each other by an operator. There leads to a problem that the operator must achieve a troublesome work and input errors of the operator take place.

To solve the problem according to the present invention, there is provided a configuration as follows.

According to the present invention, a conversion of data items different in meaning from each other is conducted using an intermediate data format. That is, data of a conversion source is converted into first intermediate data in a first intermediate data format equal in meaning to the data of the conversion source. The first intermediate data is then converted into second intermediate data in a second intermediate format equal in meaning to the data of a conversion destination. The second intermediate data is converted into data in a data format of the conversion destination.

According to the present invention, the conversion described above is conducted using a first data conversion rule to convert data of a conversion source into first intermediate data, a second data conversion rule to convert the first intermediate data into second intermediate data, and a third data conversion rule to convert the second intermediate data into data of a conversion destination. Also, a conversion rule to convert data of a conversion source into data of a conversion destination is calculated using the first, second, and third conversion rules.

More specifically, according to the present invention, a data conversion rule to absorb different physical expression methods of data for respective systems is separated from a data conversion rule regarding a conversion of data with respect to the meaning to be conducted by an intra-system cooperative function. As the data conversion rule to absorb different physical expression methods of data for respective systems, a first data conversion rule set to convert data from a physical data format of each system as an object of the cooperative operation into an intermediate data format generally and commonly defined and a second data conversion rule set to convert data from an intermediate data format generally and commonly defined into a physical data format of each system as an object of the cooperative operation are beforehand defined. The first and second data conversion rules may also be uniquely determined by specifying data of an intermediate format and systems for the cooperative operation.

Other objects, features and advantages of the invention will become apparent from the following description of the embodiments of the invention taken in conjunction with the accompanying drawings.

BRIEF DESCRIPTION OF THE DRAWINGS

FIG. 1 is a block diagram showing an embodiment of the present invention;

FIG. 2 is a diagram showing an example of physical table data defining information;

FIG. 3 is a diagram showing an example of physical table data item defining information;

FIG. 4 is a diagram showing an example of common table defining information;

FIG. 5 is a diagram showing an example of common table item defining information;

FIG. 6 is a diagram showing an example of information of data conversion rule definitions between physical and common tables;

FIG. 7 is a diagram showing an example of information of conversion rule definitions between physical and common data items;

FIG. 8 is a diagram showing an example of information of data conversion rule definitions between common tables;

FIG. 9 is a diagram showing an example of information of conversion rule definitions between common data items;

FIG. 10 is a diagram showing an example of cooperative operation objective system information;

FIG. 11 is a diagram showing an example of intra-system cooperative function information;

FIG. 12 is a first example of a cooperative operation objective system definition view;

FIG. 15 is a second example of a data item conversion rule definition view;

FIG. 16 is a second example of a conversion rule definition view;

FIG. 19 is an example of an inquiry view for a data conversion rule definition state between physical and common tables;

FIG. 20 is a third example of a conversion rule definition view;

FIG. 21 is a fourth example of a data item conversion rule definition view;

FIG. 22 is a fourth example of a conversion rule definition view;

FIG. 27 is an example of information of conversion rule definitions between physical data items.

DESCRIPTION OF THE EMBODIMENTS

Figure 13:
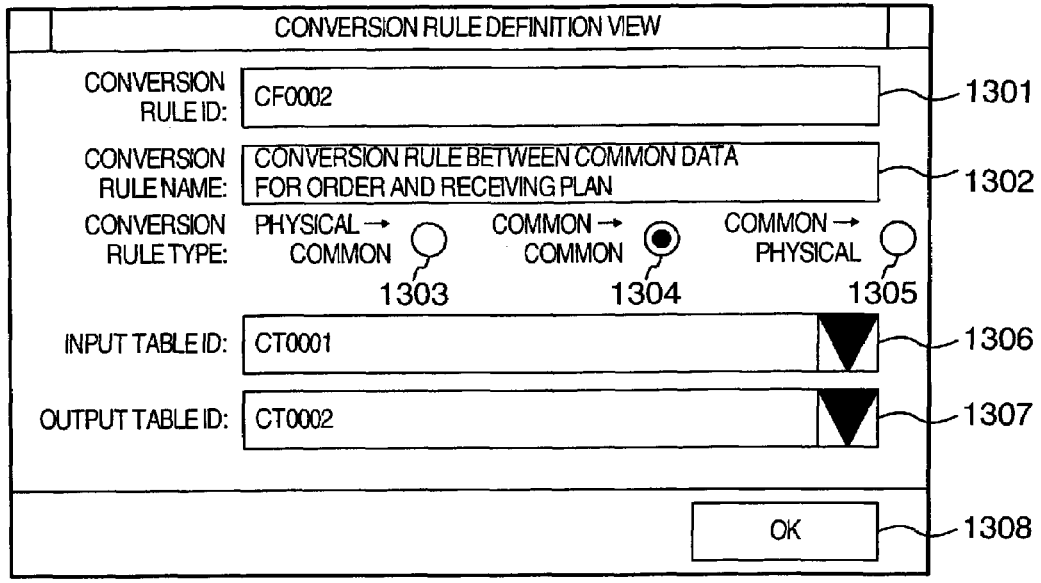
FIG. 13 is a first example of a conversion rule definition view.

Next, referring to the drawings, description will be given in detail of an embodiment of the present invention. However, the present invention is not restricted by the embodiment.

FIG. 1 shows in a block diagram an example in which the present invention is applied to data communication between different systems. In FIG. 1, numerals 1, 2, and 3 are computers, i.e., a computer 1, a computer 2, and a computer 3 each of which includes a central processing unit (CPU) having a sequential execution function according to a program, a memory to store a program and data for execution, a magnetic storage to store programs and data, input/output devices having an image display function such as a keyboard, a television screen, and a liquid-crystal screen, and a network adapter device to communicate data with a network. Numeral 4 is a network for the computers 1, 2, and 3 to communicate data with each other. The network is coupled with the network adapters of the computers 1 to 3.

Numeral 101 is a conversion rule definition input function which operates on the computer 1 for a worker to input definitions of data conversion rules. Numeral 102 is an intra-system cooperative function definition input function which operates on the computer 1 to input definitions regarding an intra-system system cooperative function to be designed and developed.

Numeral 103 is a cooperative operation objective system definition input function which operates on the computer 1 to input definitions regarding definitions of respective systems as objects of the cooperative operation. Numeral 104 is a conversion rule definition state inquiry function. The function is required by the intra-system cooperative function to be designed and developed and operates on the computer 1 to inquire a definition state of conversion rule information between physical and common data, which will be described later.

Numeral 105 is a conversion rule obtaining function to obtain a conversion rule of a conversion from a physical table of a cooperative operation objective system as an input into a physical table of the cooperative operation objective system as an output using a first conversion rule to convert data from a physical data format of the cooperative operation objective system as an input into a data format of first common data, a second conversion rule to convert data from the format of the first common data into a format of second common data, and a third conversion rule to convert data from the format of the second common data into a physical data format of the cooperative operation objective system as an output.

Numeral 106 is a conversion rule execution function which operates on the computer 1 to execute a data conversion according to execution conversion rule information, which will be described later. Numeral 107 is an adapter 1 which operates on the computer 1 to communicate via a network with an application program 1, which will be described later, to refer to data in a database 1, which will be described later. The adapter 1 includes an interface to refer to a record in a table of the database 1.

Numeral 108 is an adapter 2 which operates on the computer 1 to communicate via a network with an application program 2, which will be described later, to register data to a database 2, which will be described later. The adapter 1 includes an interface to register a record to a table of the database 1.

Numeral 109 is physical data format defining information. The information stores definitions of data formats of respective systems as objects of the cooperative operation and includes physical table defining information and physical data item defining information, which will be described later.

Numeral 110 is common data format defining information existing in the computer 1 to store common data formats generally and commonly defined. The information 110 includes common table defining information and common data format defining information, which will be described later. Numeral 111 is information of conversion rules between physical and common data. The information exists in the computer 1 and is inputted by a worker using the conversion rule definition input function 101.

The information 111 stores a conversion rule of a conversion from a physical data format of a cooperative operation objective system into a data format of common data or a conversion rule of a conversion from a data format of common data into a physical data format of the cooperative operation objective system as an output. The information 111 includes information of data conversion rule definitions between physical and common tables and information of conversion rule definitions between physical and common data items.

Numeral 112 is information of conversion rules between common data which exists in the computer 1 and which is inputted by an operator using the conversion rule definition input function 101. The information 112 stores a conversion rule to convert data from a data format of first common data into a data format of second common data. The information 112 includes information of data conversion rule definitions between common tables and information of conversion rule definitions between common data items, which will be described later.

Numeral 113 is cooperative operation objective system information which exists in the computer 1 and which is inputted by an operator using the cooperative operation objective system definition input function 103. The information 113 stores information regarding cooperative operation objective systems.

Numeral 114 is intra-system cooperative function information which exists in the computer 1 and which is inputted by an operator using the intra-system cooperative function definition input function 102. The information 114 stores information regarding intra-system cooperative functions to be designed and developed.

Numeral 115 is execution conversion rule information which exists in the computer 1 and which is obtained using the conversion rule obtaining function 105. The information 115 stores a conversion rule to directly convert a physical table of a cooperative operation objective system as an input into a physical table of a cooperative operation objective system as an output.

Numeral 116 is an application program 1 operating on the computer 2. The program 1 includes a function for a program on another computer to access the program 1 via a network. Numeral 117 is a database 1 to store data to be used by the program 1. The application program 116 is used to refer to data in the database 117, to update data therein, to add data thereto, and to delete data therefrom.

Numeral 118 is an application program 2 operating on the computer 2. The program 2 includes a function for a program on another computer to access the program 2 via a network. Numeral 119 is a database 2 to store data to be used by the program 2. The application program 118 is used to refer to data in the database 119, to update data therein, to add data thereto, and to delete data therefrom.

Referring next to FIGS. 2 to 11, description will be given of an example of data used in the embodiment.

First, description will be given of the physical data format defining information 109 shown in FIG. 1. In the embodiment, the information 109 includes the physical table defining information shown in FIG. 2 and the physical data item defining information shown in FIG. 3.

FIG. 2 is an example of the physical table defining information to keep a correspondence relationship, using as a key a physical table identifier (ID) 201 to uniquely identify a table to keep data as an object of data conversion in the embodiment, between a physical table identifier, a physical table name 202 as a name of the associated physical table, and a system identifier 203 indicating an application program in which the physical table actually exists.

FIG. 3 is an example of the physical data item defining information to keep a correspondence relationship, using as a key a physical data item identifier 301 to uniquely identify a data item of a physical table to keep data as an object of data conversion in the embodiment, between a physical data item identifier, a physical data item name 302 as a name of the associated physical data item, and a related physical table identifier 303 indicating an identifier of a physical table to which the physical data item belongs.

Next, description will be given of the common data format defining information 110 of FIG. 1. In the embodiment, the information 110 includes the common table defining information shown in FIG. 4 and the common data item defining information shown in FIG. 5.

FIG. 4 is an example of the common table defining information to keep a correspondence relationship, using as a key a common table identifier 401 to uniquely identify a table to keep data as an object of data conversion in the embodiment, between a common table identifier and a common table name 402 as a name of the associated common table.

FIG. 5 is an example of the common data item defining information to keep a correspondence relationship, using as a key a common data item identifier 501 to uniquely identify a data item of a common table to keep data as an object of data conversion in the embodiment, between a common data item identifier, a common data item name 502 as a name of the associated common data item, and a related common table identifier 503 indicating an identifier of a common table to which the common data item belongs.

Assume in the embodiment that the physical data item identifier 301 in the physical data item defining information of FIG. 3 and the common data item identifier 501 in the common data item defining information of FIG. 5 are uniquely assigned in the respective tables. Also, assume that the physical or common data item identifier has a value which immediately indicates whether the identifier indicate a physical data item identifier in the physical data item defining information or a common data item identifier in the common data item defining information. This is implemented in the data example of the embodiment by the following rule. The physical data item identifier begins with "P" and the common data item identifier begins with "C".

Next, description will be given of the information of conversion rules between physical and common data 111 shown in FIG. 1. In the embodiment, the information 111 includes the information of data conversion rule definitions between physical and common tables shown in FIG. 6 and the information of conversion rule definitions between physical and common data items shown in FIG. 7.

FIG. 6 is an example of the information of data conversion rule definitions between physical and common tables to keep a correspondence relationship, using as a key a conversion rule identifier between physical and common tables 601 to uniquely identify a data conversion rule, between a conversion rule identifier between physical and common tables, a conversion rule name between physical and common tables 602 as a name of an associated conversion rule between physical and common tables, a physical table identifier 603 as an identifier of a physical table to keep data as an input or output in the conversion rule between physical and common tables, a common table identifier 604 as an identifier of a common table to keep data as an input or output in the conversion rule between physical and common tables, and an input/output type 605.

A value of "IN" is set to the type 605 when the conversion rule between physical and common tables indicates a conversion rule to convert data of a physical table indicated by a physical table identifier into data of a common table indicated by a common table identifier. A value of "OUT" is set to the type 605 when the conversion rule between physical and common tables indicates a conversion rule to convert data of a common table indicated by a common table identifier into data of a physical table indicated by a physical table identifier.

FIG. 7 is an example of the information of conversion rule definitions between physical and common data items to keep a correspondence relationship, using as a key a conversion rule identifier between physical and common data items 701 to uniquely identify an item conversion rule indicating that a value of a data item of a physical or common table as an input is set to a data item of a physical or common table as an output, between a conversion rule identifier between physical and common data items, a conversion rule identifier between physical and common tables 702 as an identifier of a conversion rule identifier between physical and common tables to which the conversion rule between physical and common data items belongs, an output data item identifier 703 as an identifier of a data item of a physical or common table as an output unit in the conversion rule between physical and common data items, and an input data item identifier 704 as an identifier of a data item of a physical or common table as an input unit, the input data item being set to the output data item.

Next, description will be given of the conversion rule information between common data 111 shown in FIG. 1. In the embodiment, the information between common data 111 includes the information of data conversion rule definitions between common tables shown in FIG. 8 and the information of conversion rule definitions between common data items shown in FIG. 9.

FIG. 8 is an example of the information of data conversion rule definitions between common tables to keep a correspondence relationship, using as a key a conversion rule identifier between common tables 601 which is an identifier to uniquely identify a data conversion rule between common tables, between a conversion rule identifier between common tables, a conversion rule name between common tables 802 as a name of an associated conversion rule between common tables, an input common table identifier 803 as an identifier of a common table to keep data as an input in the data conversion rule between common tables, and an output common table identifier 804 as an identifier of a common table to keep data as an output in the data conversion rule between common tables.

FIG. 9 is an example of the information of conversion rule definitions between common data items to keep a correspondence relationship, using as a key a conversion rule identifier between common data items 901 which is an identifier to uniquely identify an item conversion rule indicating that a value of a data item of a common table as an input is set to a data item of a common table as an output, between a conversion rule identifier between common data items, a conversion rule identifier 902 as an identifier of a data conversion rule between common tables to which the conversion rule between common data items belongs, an output data item identifier 903 as an identifier of a data item of a common table as an output unit in the conversion rule between common data items, and an input data item identifier 904 as an identifier of a data item of a common table as an input to be set to the output data item.

In the conversion rule information between physical and common data and the conversion rule information between common data, a correspondence relationship is established between a data item of a table as an input and a data item of a table as an output. However, more complicated data conversion rules can be used when the conversion rule information between physical and common data and the conversion rule information between common data include information such as an extraction rule indicating which one of the records of an input table is used as an object of the data conversion, an output calculation formula to calculate a value of a data item as an output using a value of a data item as an input, and classification of a reference input table and a referring table to create a record of an output table using values of a plurality of input tables.

Next, description will be given of the cooperative operation objective system information 113 shown in FIG. 1.

FIG. 10 is an example of the information 113 to keep a correspondence relationship, using as a key a system identifier 1001 to uniquely identify a cooperative operation objective system, between a system identifier, a system name 1001 as a name of the system, and an adapter identifier 1003 to uniquely identify an adapter to communicate with the system to access data of the system.

Next, description will be given of the intra-system cooperative function information 114 shown in FIG. 1.

FIG. 11 is an example of the intra-system cooperative function information to keep a correspondence relationship, using as a key an intra-system cooperative function identifier 1101 to uniquely identify an intra-system cooperative function, between an intra-system cooperative function identifier, an intra-system cooperative function as a name of an intra-system cooperative 1102, an input system identifier as an identifier of a system as an input of the intra-system cooperative function 1103, an output system identifier as an identifier of a system as an output of the intra-system cooperative function 1104, an identifier of conversion rule between common tables as an identifier of a data conversion rule between common table to be executed by the intra-system cooperative function, and an execution conversion rule identifier 1106 as an identifier of a conversion rule obtained by the conversion rule obtaining function 105, the conversion rule being executed by the intra-system cooperative function.

Assume that the database 1 (117) of FIG. 1 includes a table for use in the execution of processing of the application program 1, namely table "ORDER" to keep order data. The table includes "ORDER_NO" as a data item indicating an identifier to uniquely identify one order, "ORDER_PSN" as a data item indicating a name of a person having issued the order, "ORDER_SCTN" as a data item indicating a section to which the person having issued the order belongs, "ORDER_ITM" as a data item indicating a code to uniquely identify an article as an object of the order, "ORDER_QTY" as a data item indicating a quantity of articles to be ordered, "ORDER_CMPNY" as a data item indicating a code to uniquely identify a company as a destination of the order, "ARRIVING_DATE" as a data item indicating an arriving date of the ordered article, and "ORDER_DATE" as a data item indicating "year, month, day" of issuance of the order.

Also, assume that the database 2 (119) of FIG. 1 includes tables for use in the execution of processing of the application program 2, namely table "PCHODR" indicating order data and TABLE "RCVPLN" indicating an article receiving plan. Table "PCHODR" indicating order data includes "PONO" as a data item indicating an identifier to uniquely identify one order, "ITMCD" as a data item indicating a code to uniquely identify an item as an object of the order, "QNTTY" as a data item indicating a quantity of items to be ordered, "RCVDT" as a data item indicating a receiving date of the ordered item, and "ISSDT" as a data item indicating "year, month, day" of issuance of the order. Table "RCVPLN" indicating an article receiving plan includes "INPNO" as a data item indicating an identifier to uniquely identify one item receiving plan, "ITMCD" as a data item indicating a code to uniquely identify an article of the receiving plan, "QNTTY" as a data item indicating a quantity of items of the receiving plan, "INCDT" as a data item indicating a planned receiving date of the items of the receiving plan, and "ISSDT" as a data item indicating "year, month, day" of registration of the receiving plan.

Next, assuming a situation in which workers design and develop intra-system cooperative functions, description will be given of work of the workers and the respective functions of FIG. 1.

First, description will be given of assumptions regarding the contents of design and development, workers, and data considered in the embodiment.

Description will now be given of the design and development of intra-system cooperative functions 1 and 2 in the embodiment. In the intra-system cooperative function 1, data stored in table "ORDER" existing in the database 1 of FIG. 1 and keeping data representing order data of the application program 1 is obtained via the adapter 1 and the application program 1. The obtained data is converted into data in a data format of table "PCHODR" existing in the database 2 of FIG. 2 and keeping data representing order data of the application program 2. The converted data is registered via the adapter 2 and the application program 2 to table "PCHODR". In the intra-system cooperative function 2, data kept in table "ORDER" is obtained via the adapter 1 and the application program 1. The obtained data is converted into a data format of table "RCVPLN" existing in the database 2 of FIG. 2 and keeping data representing data of receiving plan of the application program 2. The converted data is registered via the adapter 2 and the application program 2 to table "RCVPLN".

Assume that the work to implement the intra-system cooperative functions 1 and 2 are achieved by three workers 1, 2, and 3.

Assume that the worker 1 is a worker for the design and development of the intra-system cooperative functions 1 and 2 and understands requirements such as a target system to be accessed by the intra-system cooperative functions 1 and 2, meaning of data to be obtained therefrom, and meaning of data of a system for which the obtained data is to be converted. Assume that the worker 1 knows which one of the adapters is to be used to access data of each system. Assume that the worker 1 has knowledge about the common table defining information and understands meaning of each common data item. Assume that the worker 1 has not knowledge about the physical table defining information of each system in each system, i.e., in each of the application programs 1 and 2, for example, a table having stored each data, data items kept in each table, a data item name of each data item.

Assume that the worker 2 is a worker to inspect data formats in the application program 1, has knowledge about the physical table defining information in the application program 1, and understands meaning of each physical data item. Assume that the worker 2 has knowledge about the common table defining information and understands meaning of each common data item.

Assume that the worker 3 is a worker to inspect data formats in the application program 2, has knowledge about the physical table defining information in the application program 2, and understands meaning of each physical data item. Assume that the worker 3 has knowledge about the common table defining information and understands meaning of each common data item.

Assume that the workers 2 and 3 do not have knowledge about requirements for kinds of intra-system cooperative functions to be developed.

Assume that the common table defining information shown in FIGS. 4 and 5 are defined before the present work, and the workers 1 to 3 understand the contents of the information.

In conjunction with the embodiment, description will not be given in detail of a method of defining the common table defining information. However, there may be used a method to define the information using a data definition input function or a method in which a common table is designed using another data design aid program to obtain electronic data as a result of the design and the electronic data is read in the system using a program or a device having an electronic data read function.

Based on the assumptions, description will be given of work achieved by the respective workers and the functions shown in FIG. 1.

First, using the cooperative operation objective system definition input function 103, the worker 1 defines systems cooperatively operating using intra-system cooperative functions as objects of the design and development work. According to a command execution from an input/output device operated by the worker 1 or an execution indication from a mouse operated by the worker 1, a cooperative operation objective system definition view is displayed on the view of the input/output device.

FIG. 12 shows an example of the cooperative operation objective system definition view. Numeral 1201 is a field to input a system identifier 1001 of FIG. 10. Numeral 1202 is a field to input a system name 1002 of FIG. 10. Numeral 1203 is a field to input an adapter identifier 1003 of FIG. 10. When the worker 1 inputs data items in the respective input fields and pushes or depresses a register button 1204 using an input device such as a mouse, the cooperative operation objective system definition input function inserts in the cooperative operation objective system information a record including data items having the input values of the fields 1201 to 1203, respectively. For example, when the resister button is depressed in a state of the field input values shown in FIG. 12, the cooperative operation objective system definition input function inserts a record 1004 of FIG. 10. The record indicates that a system with a system identifier identified by a value of APP0001 has a system name of application program 1 and can be accessed via an adapter with an adapter identifier identified by a value of ADP0001.

Similarly, the worker 1 registers a record 1005 shown in FIG. 10 using the cooperative operation objective system definition input function and the cooperative operation objective system definition view.

Next, using the conversion rule definition input function 101 of FIG. 1, the worker 1 defines the information of conversion rules between common data required for the intra-system cooperative functions as objects of the design and development work. In this example, the worker 1 uses the conversion rule definition input function to define the information of conversion rules between common data. However, the workers 2 and 3 can also use the conversion rule definition input function to define the information of conversion rules between physical data and common data.

The conversion rule definition input function displays a conversion rule definition view on the screen of the input/output device according to a command execution from the input/output device operated by the worker 1 or an execution indication from a mouse operated by the worker 1.

FIG. 13 shows an example of the conversion rule definition view. Numeral 1301 is a field to input the identifier of a conversion rule between physical and common tables 601 of FIG. 6 or the identifier of a conversion rule between common tables 801. Numeral 1302 is a field to input the identifier of a name of a conversion rule between physical and common tables 602 of FIG. 6 or the identifier of a name of a conversion rule between common tables 802. Numerals 1303 to 1305 are radio buttons to specify whether the conversion rule defined by the worker is a conversion rule from a physical table to a common table, a conversion rule from a common table to a common table, or a conversion rule from a common table to a physical table. Using an input device such as a mouse, the worker checks the button 1303 for a conversion rule from a physical table to a common table, the button 1304 for a conversion rule from a common table to a common table, or the button 1305 for a conversion rule from a common table to a physical table. In this case, the worker 1 desires to define a conversion rule from a common table to a common table and hence checks the button 1304.

Numeral 1306 is an input field to specify a physical or common table identifier as an input of the conversion rule. When the worker pushes the button 1306 using an input device such as a mouse, a list of physical table identifiers defined in the physical table defining information is displayed in a drop-down list format if the button 1303 is checked and a list of common table identifiers defined in the common table defining information is displayed in a drop-down list format if the button 1304 or 1305 is checked. Therefore, the worker specifies an identifier by selecting from the pertinent list a physical or common table identifier as an input of the conversion rule. Numeral 1307 is an input field to specify a physical or common table identifier as an output of the conversion rule. When the worker pushes the button 1307 using an input device such as a mouse, a list of common tables registered to the common table defining information is displayed in a drop-down list format if the button 1303 or 1304 is checked and a list of physical tables registered to the physical table defining information is displayed in a drop-down list format if the button 1305 is checked. Therefore, the worker specifies an identifier by selecting from the pertinent list a physical or common table identifier as an output of the conversion rule.

After one of the buttons 1303 to 1305 is checked and data is inputted to each of the input fields 1301, 1302, 1306, and 1307, when the worker pushes an OK button 1308 using an input device such as a mouse, the conversion rule definition input function registers a record to the information of data conversion rule definitions between physical and common tables or the information of data conversion rule definitions between common tables according to the button 1303, 1304, or 1304 checked as above.

If the button 1303 is checked, the conversion rule definition input function registers to the information of data conversion rule definitions between physical and common tables a record in which the value inputted to the field 1301 is set to the identifier of conversion rule between physical and common tables 601, the value inputted to the field 1302 is set to the name of conversion rule between physical and common tables 602, the value inputted to the field 1306 is set to the physical table identifier 603, the value inputted to the field 1307 is set to the common table identifier 603, and "IN" is set to the input/output type 605.

If the button 1304 is checked, the conversion rule definition input function registers to the information of data conversion rule definitions between common tables a record in which the value inputted to the field 1301 is set to the identifier of conversion rule between common tables 801, the value inputted to the field 1302 is set to the name of conversion rule between common tables 802, the value inputted to the field 1306 is set to the input common table identifier 803, and the value inputted to the field 1307 is set to the output common table identifier 804.

If the button 1305 is checked, the conversion rule definition input function registers to the information of data conversion rule definitions between physical and common tables a record in which the value inputted to the field 1301 is set to the identifier of conversion rule between physical and common tables 601, the value inputted to the field 1302 is set to the name of conversion rule between physical and common tables 602, the value inputted to the field 1307 is set to the physical table identifier 603, the value inputted to the field 1306 is set to the common table identifier 604, and "OUT" is set to the input/output type 605.

After having registered the record to the information of data conversion rule definitions between physical and common tables or the information of data conversion rule definitions between common tables, the conversion rule definition input function changes the view from the conversion rule definition view of FIG. 13 to a data item conversion rule definition view.

Figure 14:
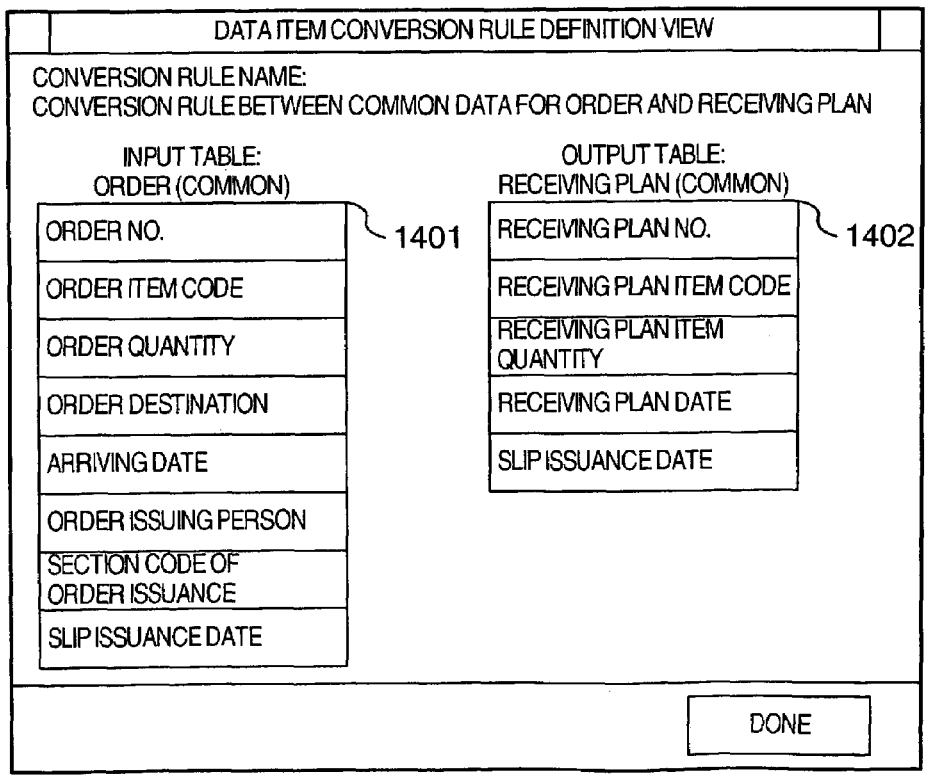
FIG. 14 is a first example of a data item conversion rule definition view.

FIG. 14 is a first example of the data item conversion rule definition view.

In FIG. 14, numeral 1401 indicates data items of an input table specified in the view of FIG. 13. That is, from the physical or common data item defining information, a record having a related physical or common table associated with a value specified by the worker as the input table ID 1306 in the view of FIG. 13 is extracted, and the physical or common data items of the record are displayed in a list. Numeral 1402 indicates a list displayed as follows. A record having a related physical or common table associated with a value specified by the worker as the output table ID 1307 in the view of FIG. 13 is extracted, and the physical or common data items of the record are displayed in a list. In the item conversion rule definition view, the worker prepares a user interface to establish a correspondence relationship between the data items of the input table and those of the output table. For example, there exists a user interface in which when the worker specifies from an input device such as a mouse the data items of the input table and those of the output table, a correspondence relationship is established between the data items of the input table and those of the output table.

FIG. 15 shows an example of the correspondence relationship indicated by arrows 1501. In the example of FIG. 15, the worker defines data items by establishing a corresponding relationship therebetween such that the values of the input table data items "order number", "order item code", "order quantity", "arriving date", and "slip issuance date" are set respectively to the output table data items "receiving plan number", "receiving plan item code", "receiving plan quantity", "receiving plan date", and "slip issuance date".

In FIG. 15, when the worker pushes the end button 1502 by an input device such as a mouse, the conversion rule definition input function registers a record to the information of conversion rule definitions between physical and common data items or the information of conversion rule definitions between common data items according to the button 1303, 1304, or 1305 of FIG. 13 checked by the worker.

If the button 1303 is checked, the function registers to the information conversion rule definitions between physical and common data items a record in which a unique value other than the values of the identifier of conversion rule between physical and common data items 701 and the identifier of conversion rule between common data items 901 registered to the information of conversion rule definitions between physical and common data items and the information of conversion rule definitions between common data items is set to the value of the identifier of conversion rule between physical and common data items 701, a value specified to the field 1301 by the worker in FIG. 13 is set to the value of the identifier of conversion rule between physical and common tables 702, a common data item identifier of a data item as an end point of the arrow is set to the value of the output data item identifier 703, and a physical data item identifier of a data item as a start point of the arrow is set to the value of the input data item identifier 704.

If the button 1304 is checked, the function registers to the conversion rule defining information between common data items a record in which a unique value other than the values of the identifier of conversion rule between physical and common data items 701 and the identifier of conversion rule between common data items 901 registered to the conversion rule defining information between physical and common data items and the conversion rule defining information between common data items is set to the value of the identifier of conversion rule between common data items 901, a value specified to the field 1301 by the worker in FIG. 13 is set to the value of the identifier of conversion rule between common tables 902, a common data item identifier of a data item as an end point of the arrow is set to the value of the output data item identifier 903, and a physical data item identifier of a data item as a start point of the arrow is set to the value of the input data item identifier 904.

If the button 1305 is checked, the function registers to the information of conversion rule definitions between physical and common data items a record in which a unique value other than the values of the identifier of conversion rule between physical and common data items 701 and the identifier of conversion rule between common data items 901 registered to the information of conversion rule definitions between physical and common data items and the information of conversion rule definitions between common data items is set to the value of the identifier of conversion rule between physical and common data items 701, a value specified to the field 1301 by the worker in FIG. 13 is set to the value of the identifier of conversion rule between physical and common tables 702, a physical data item identifier of a data item as an end point of the arrow is set to the value of the output data item identifier 703, and a common data item identifier of a data item as a start point of the arrow is set to the value of the input data item identifier 704.

When the worker 1 inputs or selects data items in the input fields and establishes a correspondence relationship between the data items as shown in the view examples of FIGS. 13 and 15, the function registers a record 906 shown in FIG. 9 to the information of conversion rule definitions between common data items.

Figure 17:
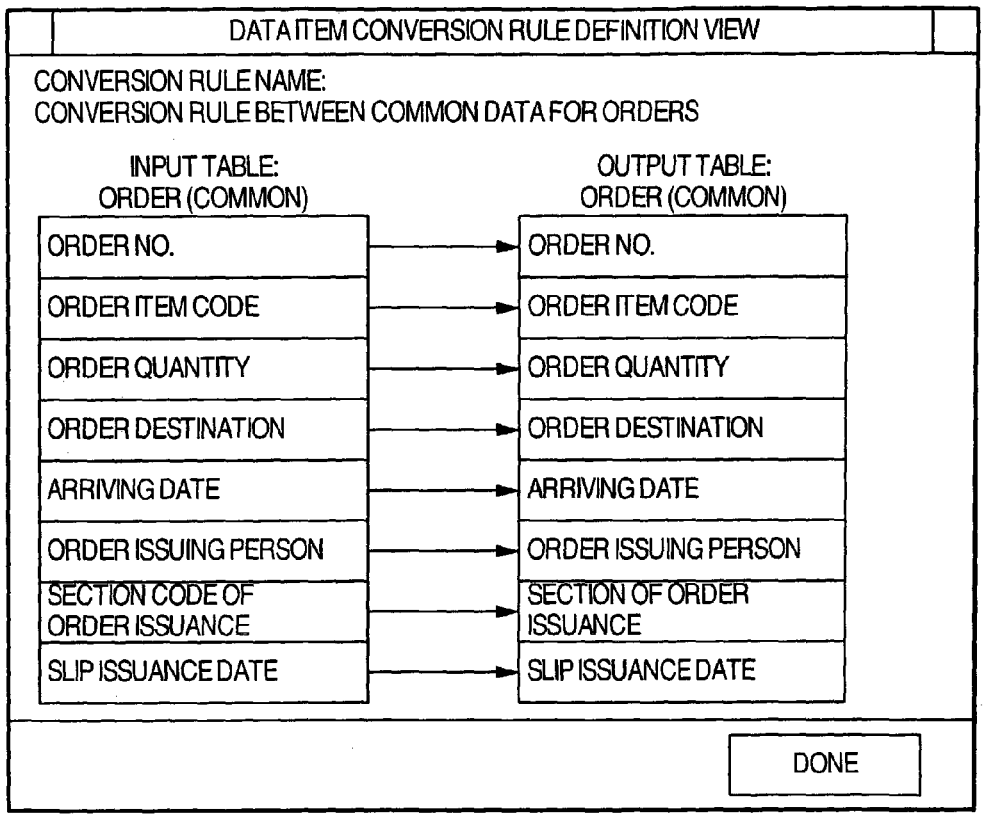
FIG. 17 is a third example of a data item conversion rule defining view.

Similarly, when the worker 1 inputs or selects data items in the input fields and establishes a correspondence relationship between the data items as shown in FIGS. 16 and 17, the function registers a record 905 shown in FIG. 9 to the information of conversion rule definitions between common data items.

As a result of the work, the worker 1 defines a conversion rule, which is used by the intra-system cooperative function 1, between order data in the common data format and order data in the common data format and a conversion rule, which is used by the intra-system cooperative function 2, between order data in the common data format and receiving plan data in the common data format and then registers the rules to the information of conversion rule definitions between common data 112.

Next, using a computer, the worker 1 defines by the intra-system cooperative function definition input function 102 the intra-system cooperative function information 114 regarding the intra-system cooperative functions to be designed and developed.

The intra-system cooperative function definition input function displays an intra-system cooperative function definition view according to a command execution from an input/output device and a mouse operation conducted by the worker 1.

Figure 18:
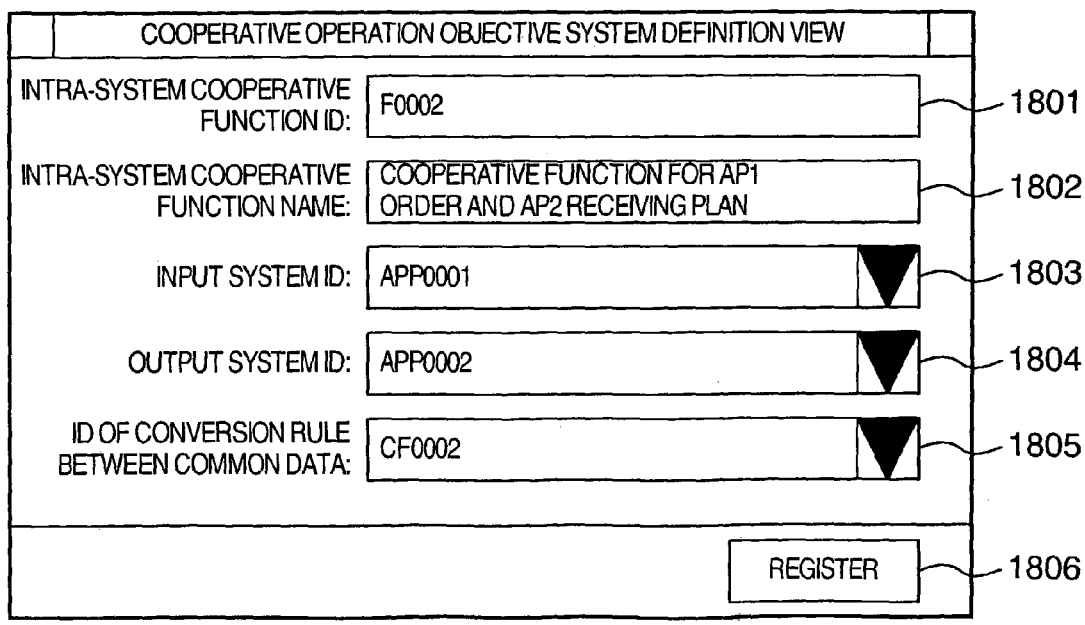
FIG. 18 is a second example of a cooperative operation objective system definition view.

FIG. 18 shows an example of the intra-system cooperative function definition view. Numeral 1801 is a field to input an intra-system cooperative function identifier 1101 of FIG. 11. Numeral 1802 is a field to input an intra-system cooperative function name 1102 of FIG. 11. Numeral 1803 is a field to input an input system identifier 1103 of FIG. 11. When the worker 1 pushes a field 1803 by an input device such as a mouse, a list of system identifiers registered to the cooperative operation objective system information is displayed in the format of a drop-down list. The worker 1 then selects one system identifier from the list to specify the system identifier as an input of the intra-system cooperative function. Numeral 1804 is a field to input an output system identifier 1104 of FIG. 11. When the worker 1 pushes a field 1804 by an input device such as a mouse, a list of system identifiers registered to the cooperative operation objective system information is displayed in the format of a drop-down list. The worker 1 then selects one system identifier from the list to specify the system identifier as an output of the intra-system cooperative function. Numeral 1805 is a field to input an identifier of conversion rule between common tables 1105 of FIG. 11. When the worker 1 pushes a field 1805 by an input device such as a mouse, a list of identifiers of conversion rules between common tables registered to the conversion rule information between common data is displayed in the format of a drop-down list. The worker 1 then selects one of the identifiers of conversion rules between common tables to specify the identifier of a conversion rule between common tables to be executed by the intra-system cooperative function.

When the worker 1 inputs data items to the input fields 1801 to 1805 and pushes the register button 1806 using an input device such as a mouse, the cooperative operation objective system definition input function inserts in the cooperative operation objective system information a record in which the input values of the fields 1801 to 1805 are set to the values of the associated data items, respectively.

For example, when the worker pushes the register button in a state of the values of the input fields shown in FIG. 18, the cooperative operation objective system definition input function inserts a record 1108 shown in FIG. 11 in the cooperative operation objective system information. The record indicates that the intra-system cooperative function identified by an intra-system cooperative function identifier with a value of F0002 has an intra-system cooperative function name of "intra-system cooperative function 2", obtains data from a system identified by a system ID with a value of APP0001, conduct a data conversion using a conversion rule between common tables identified by an identifier of conversion rule between common tables with a value of CF0001, and registers converted data to a system identified by a system ID with a value of APP0002.

Similarly, using the cooperative operation objective system definition input function and the cooperative operation objective system definition view, the worker 1 registers a record 1107 shown in FIG. 11 as the intra-system cooperative function information regarding the intra-system cooperative function 2.

As a result of the work up to this point, the worker 1 logically designs the intra-system cooperative functions 1 and 2. It is to be appreciated that the worker 1 can completely achieve the work up to this point without any knowledge of, for example, a correspondence relationship between a name of table and data stored therein and a name of each data item in the intra-system cooperative functions 1 and 2 as the cooperative operation objective systems.

In this situation, to complete specifications of the intra-system cooperative functions 1 and 2 and to make these functions executable, it is required to define conversion rules between data formats in the respective systems and data formats in the common tables. This work is achieved by the workers 2 and 3.

To recognize requirements of definitions of conversion rules for the conversion rules between data formats in the respective systems and data formats in the common tables, items not defined yet, and items not determined yet, the workers 2 and 3 use the conversion rule definition state inquiry function 104.

The conversion rule definition state inquiry function displays on the screen of the input/output device an inquiry view for a state of data conversion rule definitions between physical and common tables according to a command execution from an input/output device or a mouse operation conducted by the worker 2 or 3.

FIG. 19 shows an example of the inquiry view for a state of data conversion rule definitions between physical and common tables. FIG. 19 is a view to display a list of information of data conversion rule definitions between physical and common tables to be defined and a state indicating, for each of the information items of data conversion rule definitions between physical and common tables, whether or not the information item is beforehand defined.

Using information registered to the cooperative objective system information, the physical table defining information, the information of data conversion rule definitions between physical and common tables, the information of data conversion rule definitions between common tables, and the intra-system cooperative function information, the conversion rule definition state inquiry function creates information through processing as below.

In a first step, the function conducts a combining operation for the intra-system cooperative function information and the information of data conversion rule definitions between common tables using as a key each identifier of conversion rule between common tables to create a set of records each of which includes a data item A1 set to an input common table identifier of the information of data conversion rule definitions between common tables, a data item A2 set to a value of IN, and a data item A3 set to an input system identifier of the intra-system cooperative function information. If the set includes a plurality of records in which the data items A1, A2, and A3 are completely equal to each other, these records are erased excepting only one thereof to create a set of records not including any duplicated records.

In a second step, the function conducts a combining operation for the intra-system cooperative function information and the information of data conversion rule definitions between common tables using as a key each identifier of conversion rule between common tables to create a set B of records each of which includes a data item B1 set to an output common table identifier of the information of data conversion rule definitions between common tables, a data item B2 set to a value of OUT, and a data item B3 set to an output system identifier of the intra-system cooperative function information. If the set includes a plurality of records in which the data items A1, A2, and A3 are completely equal to each other, these records are erased excepting only one thereof to create a set B of records not including any duplicated records.

In a third step, the function conducts a combining operation for the cooperative operation objective system information and the physical table defining information using as keys a system identifier of a cooperative operation objective system and a related system identifier of the physical table defining information to create a set C of records each of which includes a data item C1 set to the system identifier of a cooperative operation objective system and a data item B2 set to a physical table identifier of the physical table defining information.

In a fourth step, the function conducts a combining operation for the record set C and the information of data conversion rule definitions between physical and common tables using as keys the data item C2 of the record set C and a physical table identifier of the information of data conversion rule definitions between physical and common tables to create a set D of records each of which includes a data item D1 set to a common table identifier of the information of data conversion rule definitions between physical and common tables, a data item D2 set to an input/output type of the information of data conversion rule definitions between physical and common tables, and a data item B3 set to the data item C1 of the record set C.

In a fifth step, a check is made for each record a of the record set A. If the data items A1 to A3 of the record a are equal in value respectively to the data items D1 to D3, a data item A4 indicating "defined" is added to the record a. Otherwise, a data item A4 indicating "undefined" is added to the record a to resultantly create a set A' of records.

In a sixth step, a check is made for each record b of the record set B. If the data items B1 to B3 of the record a are equal in value respectively to the data items D1 to D3, a data item B4 indicating "defined" is added to the record b. Otherwise, a data item A4 indicating "undefined" is added to the record B to resultantly create a set B' of records.

By adding the record set A' to the record set B', the target information is obtained.

In FIG. 19, fields 1901 to 1904 are used to respectively display the data items A1 to A4 of the record set A' or the data items B1 to B4 of the record set B'.

Using the view, the worker can check a list of information of data conversion rule definitions between physical and common tables and whether each data item is defined or undefined. That is, even if the worker does not know the contents of the intra-system cooperative functions to be developed, it is possible to determine information of data conversion rules between physical common tables to be defined.

Numerals 1905 to 1907 are definition buttons. When the worker depresses one of the buttons using an input device such as a mouse, the conversion rule definition state inquiry function executes the conversion rule definition input function 101 to change the view from the inquiry view for a state of data conversion rule definitions between physical and common tables of FIG. 19 to the conversion rule definition view. In this situation, description will be given of a case in which the worker 2 pushes the definition button 1905.

FIG. 20 shows a view example of the conversion rule definition view displayed as a result of transition when the worker pushes the definition button in FIG. 19. In FIG. 20, since the data item 1902 of FIG. 19 has a value of IN, the conversion rule definition input function automatically judges the condition and hence automatically checks a field 2003. If the data item 1902 of FIG. 19 has a value of OUT, the conversion rule definition input function automatically checks a field 2004. Also, to a field 2006, the conversion rule definition input function automatically sets the value of the field 1901 of FIG. 19 in advance. Other input items, namely, items 2001, 2002, and 2005 are specified when the worker 2 inputs data items thereto using an input/output device.

To specify an identifier of a physical table as an input to the field 2005, a physical table having a physical table identifier of PT0101 must be beforehand registered to the physical data format defining information. In the embodiment, description will not be given in detail of a method of defining the physical table defining information. However, there may be used a method in which the physical table defining information is defined using the data definition input function or a method in which a common table is designed using another data design aid program and then a program or a device having a function to read electronic data as a result of the design is used to read the electronic data. Depending on application programs and databases, there is provided an interface to acquire information of data formats controlled by the application programs and databases. Therefore, it is possible to use a method in which such an interface is used to acquire information regarding data format definitions from the application program 1 or the database 1.

Assume that before the input operation is conducted in the view of FIG. 20 by either one of the methods or another method, the worker 2 beforehand defines information regarding the physical table having a physical table identifier of PT0101, namely, a record 204 of FIG. 2 and records 304 of FIG. 3. Assume similarly that before the input operation is conducted in the view of FIG. 20, the worker 3 beforehand defines a record 205 of FIG. 2 and records 305 of FIG. 3 and a record 206 of FIG. 2 and records 306 of FIG. 3.

As already described in conjunction with FIGS. 13 to 15, when the worker 2 inputs data items to input fields or selects data items and establishes a correspondence relationship between data items using arrows as shown in FIGS. 20 and 21, the conversion rule definition input function registers a record 606 of FIG. 6 and records 705 of FIG. 7 respectively to the information of data conversion rule definitions between physical and common tables and the information of data conversion rule definitions between physical and common data items.

Figures 23, 24:
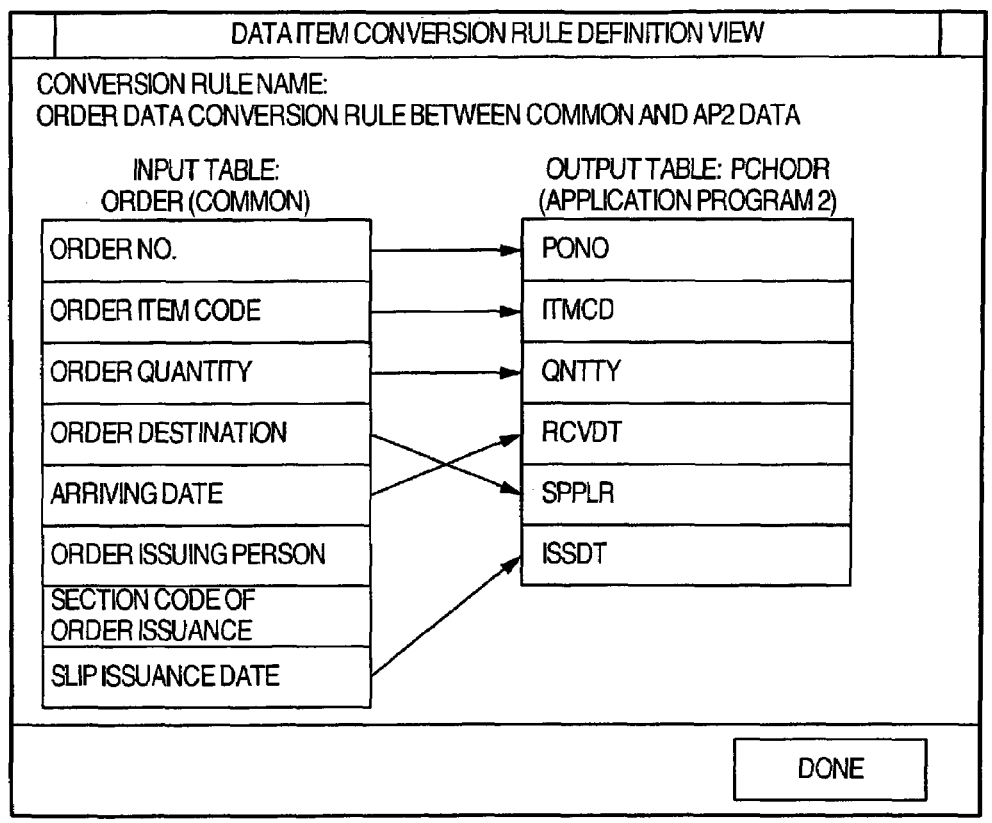
FIG. 23 is a fifth example of a data item conversion rule definition view.
FIG. 24 is a fifth example of a conversion rule definition view.

Similarly, when the worker 3 inputs data items to input fields or selects data items and establishes a correspondence relationship between data items using arrows as shown in the view examples of FIGS. 22 and 23, the conversion rule definition input function registers a record 607 of FIG. 6 and records 706 of FIG. 7 respectively to the information of data conversion rule definitions between physical and common tables and the information of conversion rule definitions between physical and common data items. When the worker 3 inputs data items to input fields or selects data items and establishes a correspondence relationship between data items using arrows as shown in the view example of FIGS. 24 and 25, the conversion rule definition input function registers a record 608 of FIG. 6 and records 707 of FIG. 7 respectively to the information of data conversion rule definitions between physical and common tables and the information of conversion rule definitions between physical and common data items.

As a result of the work of the workers 2 and 3, the conversion rules between the data formats of the respective systems and the data formats of the common tables are defined. It is to be appreciated in this case that in the work up to this point, the workers 2 and 3 can completely achieve the operation by defining the conversion rules as a correspondence relationship with respect to meaning between the actual formats of physical data in the respective systems and the formats of the common data without paying attention to the contents of the intra-system cooperative functions under development.

Next, description will be given of execution of the intra-system cooperative functions according to the conversion rules created as above.

Assumed in the description of the embodiment that before an intra-system cooperative function is executed, the conversion rule obtaining function 105 of FIG. 1 obtains; using a first conversion rule from a physical table of a cooperative operation objective system as an input to an input common table, a second conversion rule from the input common table to an output common table, a third conversion rule from the output common table to a cooperative operation objective system and a technique described in JP-A-2001-209562; a direct conversion rule from the physical table of the cooperative operation objective system as an input to the physical table of the cooperative operation objective system as an output. The conversion rule execution function 106 of FIG. 1 executes the obtained conversion rule. However, it is also possible to use a method in which the conversion rule execution function applies the first conversion rule to data of the physical table of the cooperative operation objective system as an input to create intermediate data 1. The function then applies the second conversion rule to the intermediate data 1 to create intermediate data 2. Thereafter, the function applies the third conversion rule to the intermediate data 2 to resultantly convert the data into data of the physical table of the cooperative operation objective system as an output.

Next, description will be given of processing in which the conversion rule obtaining function 105 of FIG. 1 derives the first to third conversion rules to obtain, using the information of the rules, a direct conversion rule from the physical table of the cooperative operation objective system as an input to the physical table of the cooperative operation objective system as an, output.

First, the worker 1 specifies an identifier of an intra-system cooperative function to obtain the direct conversion rule from the physical table of the cooperative operation objective system as an input to the physical table of the cooperative operation objective system as an output, and then executes the conversion rule obtaining function.

The conversion rule obtaining function obtains the conversion rule through processing steps as below.

In a first step, the function retrieves the intra-system cooperative function information to acquire a record having an intra-system cooperative function identifier specified by the worker 1.

In a second step, the function retrieves the information of data conversion rule definitions between common tables to acquire a record having an identifier of conversion rule between common tables equal to that of the record acquired in the first step. The record obtained in the second step represents the second conversion rule from the common table to the common table.

In a third step, the function retrieves the physical table defining information to acquire a record having a related system identifier equal to an input system identifier of the record acquired in the first step to resultantly obtain a set A of physical table definition identifications of the records thus acquired. The function also acquires a record having a related system identifier equal to an output system identifier of the record acquired in the first step to resultantly obtain a set B of physical table definition identifications of the records thus acquired.

In a fourth step, the function retrieves a record of the information of data conversion rule definitions between physical and common tables to obtain a record, the record having a physical table identifier existing in the set A of the physical table identifiers, a common table identifier equal to an input common table identifier of the record acquired in the second step, and an input/output type set to IN. The record acquired in the fourth step represents the first conversion rule from the physical table of the cooperative operation objective system as an input to the common table.

In a fifth step, the function retrieves a record of the information of data conversion rule definitions between physical and common tables to obtain a record, the record having a physical table identifier existing in the set B of the physical table identifiers, a common table identifier equal to an output common table identifier of the record acquired in the second step, and an input/output type set to OUT. The record acquired in the fifth step represents the third conversion rule from the common table to the cooperative operation objective system as an output.

In this way, using the intra-system cooperative function identifier specified by the worker 1, the conversion rule obtaining function can derive the first to third conversion rules from the physical table of the cooperative operation objective system as an input to the input common table.

In a sixth step, using the first and second conversion rules, the function first obtains a fourth conversion rule from the physical table of the cooperative operation objective system as an input to the output common table. This can be achieved by applying a predetermined processing procedure of conversion rule obtaining processing.

In a seventh step, using the fourth conversion rule obtained in the sixth step and the third conversion rule, the function first obtains a fifth conversion rule from the physical table of the cooperative operation objective system as an input to the physical table of the cooperative operation objective system as an output. This can be achieved by applying a technique described in JP-A-2001-209562, i.e., a processing procedure of conversion rule obtaining processing illustrated in the flowchart of FIG. 2. The fifth conversion rule is namely a conversion rule, which is to be obtained by the conversion rule obtaining function, from the physical table of the cooperative operation objective system as an input to the physical table of the cooperative operation objective system as an output.

Finally, in an eighth step, the function stores the fifth conversion rule obtained in the seventh step in the execution conversion rule information 115 and stores the identifier of the stored execution conversion rule as the execution conversion rule identifier of the record in the intra-system cooperative function information.

As a result of the steps above, using the intra-system cooperative function identifier specified by the worker 1, the conversion rule obtaining function automatically obtains conversion rules from a physical table of a cooperative operation objective system as an input of the intra-system cooperative function into a physical table of the cooperative operation objective system as an output and then obtains a conversion rule from a physical table of a cooperative operation objective system as an input into a physical table of the cooperative operation objective system as an output. The result of the operation is stored in the execution conversion rule information 115. However, in the embodiment, the execution conversion rule information includes execution conversion rule defining information shown in FIG. 26 and the information of conversion rule definitions between physical data items shown in FIG. 27.

Figures 25, 26:
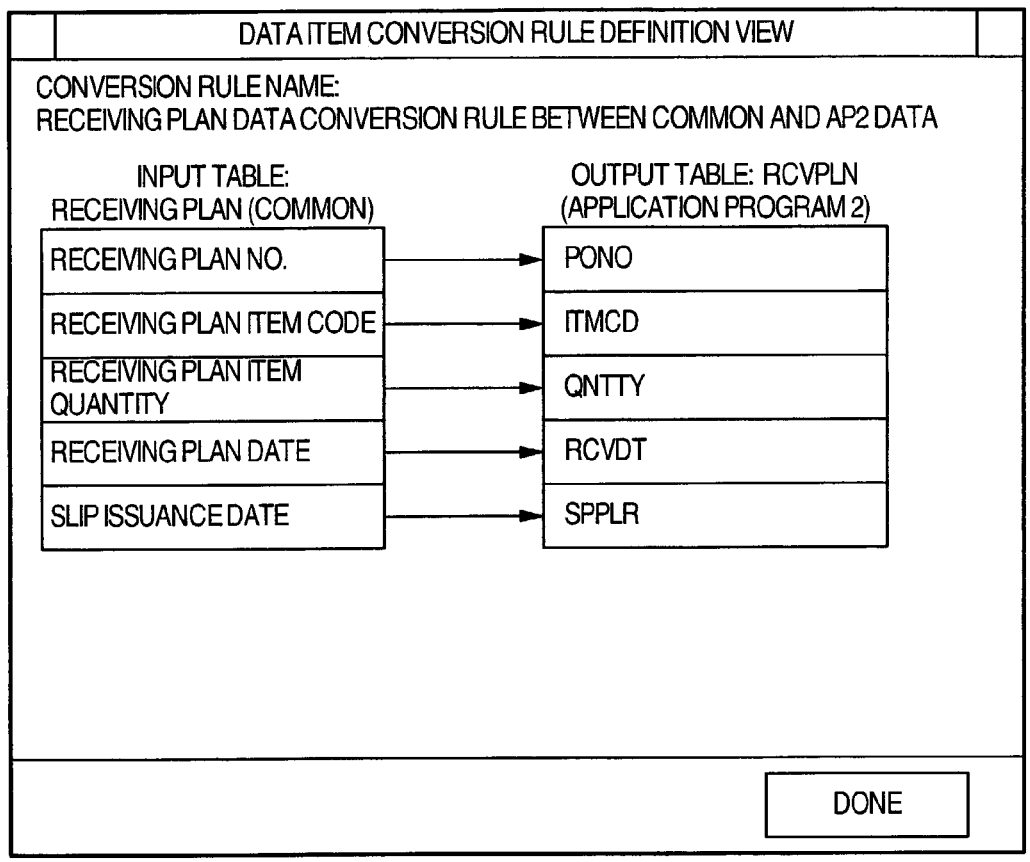
FIG. 25 is a sixth example of a data item conversion rule definition view.
FIG. 26 is an example of execution conversion rule defining information.

FIG. 26 shows an example of the execution conversion rule defining information to keep a correspondence relationship, using as a key an execution conversion rule identifier 2601 to uniquely identify a conversion rule obtained through the steps above, between an execution conversion rule identifier, an input physical table identifier 2602 as an identifier of a physical table to keep data as an input in the execution conversion rule, and an output physical table identifier 2603 as an identifier of a physical table to keep data as an output in the execution conversion rule.

FIG. 27 shows an example of the information of conversion rule definitions between physical data items to keep a correspondence relationship, using as a key an identifier of conversion rule between physical data items 2701 to uniquely identify a conversion rule between physical data items which indicates that a value of a data item in a physical table as an input is set to a data item of a physical table as an output, an identifier of conversion rule between physical data items, an execution conversion rule identifier as an identifier of an execution conversion rule to which the conversion rule between physical data items belongs 2702, an output physical data item identifier as an identifier of a data item of a physical table as an output destination in the conversion rule between physical data items 2703, and an input physical data item identifier as an identifier of a data item of a physical table as an input to be set to the output data item.

In FIGS. 26 and 27, numerals 2604 and 2705 are execution conversion rules regarding the record 1107 of FIG. 11 created as a result of the execution of the steps above by the conversion rule obtaining function. Numerals 2605 and 2706 are execution conversion rules regarding the record 1108 of FIG. 11 created as a result of the execution of the steps above by the conversion rule obtaining function.

Next, description will be given of the conversion rule execution function 106 of FIG. 1 to implement intra-system cooperative operation by executing the conversion rules created as above.

The execution conversion rules finally created as shown in FIGS. 26 and 27 are the same as those created in the above-mentioned art. Therefore, by applying a predetermined processing procedure of conversion rule processing, the execution conversion rules associated with the intra-system cooperative function 1 can be executed. That is, there can be executed processing in which order data of the application program 1 is obtained via the adapter 1 and the data conversion defined by the execution conversion rules 2604 and 2705 is executed to register the order data via the adapter 2 to the application program 2. Also, the execution conversion rules associated with the intra-system cooperative function 2 can be executed. That is, there can be executed processing in which order data of the application program 1 is obtained via the adapter 1 and the data conversion defined by the execution conversion rules 2605 and 2706 is executed to register receiving plan data via the adapter 2 to the application program 2.

In the embodiment, description has been given of an example in which the conversion rule execution function to execute a data conversion using the execution conversion rule information 115 executes the data conversion. However, a program to execute a data conversion using the execution conversion rule information can also be created according to the above-mentioned art.

To clearly describe an aspect of the present invention of provision of the information of conversion rules between common data, the configuration keeps the physical data format defining information and the common data format defining information as separated information and the information of conversion rules between physical data and common data and the information of conversion rules between common data and common data as separated information. However, there may be implemented an embodiment in which the physical data format defining information and the common data format defining information are kept as information in one table and the information of conversion rules between physical data and common data and the information of conversion rules between common data and common data are kept as information in another table such that a data item is disposed to discriminate the associated tables from each other to thereby discriminate the information items from each other.

According to the present invention, a data conversion rule to absorb physical representing methods physically representing data items different from each other in the cooperative operation objective systems and a data conversion rule regarding a data conversion in the meaning to be executed in an intra-system cooperative function can be defined by clearly separating the data conversion rules from each other. First, it is possible to define, as a data conversion rule to absorb physical representing methods of data items different from each other in the systems, a data conversion rule from a data format of any one system to an intermediate data format independently of each intra-system cooperative function and a data conversion rule from the intermediate data format to a data format of any other system. The workers can achieve the work, without paying attention to the contents of the data cooperative function to be implemented, only using knowledge regarding of the physical data formats in the respective systems and knowledge regarding the intermediate data format.

The rules are data conversion rules between data items which are equal in meaning to each other and which are different in the representation format from each other. Therefore, a data conversion rule from a data format of an objective system to an intermediate data format and a data conversion rule from the intermediate data format to a data format of an objective system can be respectively and uniquely determined only by determining data of the intermediate data format and the objective systems in other than a case in which a plurality of data formats having the same meaning exist in the objective systems.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A data conversion system including a processor and a memory device storing instructions executable by said processor for converting data transferred between a first data processing system and a second data processing system, which systems operate cooperatively in a configuration of a complex system including a plurality of data processing systems, comprising:

means for accessing a first conversion rule table, the first conversion rule table storing a data format for each of the data processing systems, an intermediate data format which is a data representation format to be commonly used for all the data processing systems, and an input/output type for indicating a direction of conversion, so as to have a correspondence relationship therebetween;

means for determining a first data format conversion rule using information identifying the first system, the first data conversion rule being a rule for converting first data into first intermediate data, the first data being expressed by a first data format which is a data expression format specific for the first system, the first data having a first meaning, the first intermediate data being expressed by an intermediate data format which is a data expression format, the first intermediate data having the first meaning of the first data but being in the intermediate data format;

means for determining a data meaning conversion rule using identifier information of the data meaning conversion rule, the data meaning conversion rule being a rule for converting the first intermediate data into second intermediate data, the second intermediate data having a second meaning but being expressed in the same intermediate data format as the first intermediate data;

means for determining a second data format conversion rule using information identifying the second system, the second data format conversion rule being a rule for converting the second intermediate data into second data, the second data being expressed by a second data format which is a data expression format specific for the second system, the second data having the second meaning, the data expression format specific for the second system being different from the data expression format specific for the first system;

means for converting the first data into the second data based on the determined first data format conversion rule, the determined data meaning conversion rule, and the determined second data format conversion rule;

means for outputting the converted second data for the second data processing system; and means for enabling multiple users to concurrently update definitions used for any of the first data format conversion rule, the data meaning conversion rule, and the second data format conversion rule, wherein, in each of the first data format conversion rule and the second data format conversion rule, data before conversion and data after conversion have identical meaning, wherein the first data format conversion rule is a conversion rule of converting physical data into common data, wherein the data meaning conversion rule is a conversion rule of converting common data into common data, wherein the second data format conversion rule is a conversion rule of converting common data into physical data, and wherein the first data format conversion rule, the data meaning conversion rule, and the second data format conversion rule are defined by referring to information of conversion rules between physical data and common data and information of conversion rules between common data and common data.

2. The data conversion system according to claim 1, wherein the means for converting the first data into the second data includes:

first conversion means for converting the first data into the first intermediate data based on the determined first data format conversion rule;

second conversion means for converting the first intermediate data into the second intermediate data based on the determined data meaning conversion rule; and third conversion means for converting the second intermediate data into the second data based on the determined second data format conversion rule.

3. The data conversion system according to claim 1, wherein the means for converting the first data into the second data includes means for calculating a rule for converting the first data into the second data based on the first data format conversion rule, the data meaning conversion rule and the determined second data format conversion rule.

4. The data conversion system according to claim 1, wherein the first data format conversion rule, data meaning conversion rule, and second data format conversion rule are defined by referring to physical data format defining information and common data format defining information.

5. The data conversion system according to claim 4, wherein:

the physical data format defining information includes physical table defining information and physical data item defining information;

the physical table defining information includes a physical table, the physical table being a table for keeping data as an object of a data conversion and a physical table identifier to uniquely identify the physical table; and the physical data item defining information includes a physical table identifier to uniquely identify a data item of the physical table for keeping data as an object of a data conversion.

6. A data conversion system according to claim 4, wherein:

the common data format defining information includes common table defining information and common data item defining information;

the common table defining information includes a common table, the common table being a table for keeping data as an object of a data conversion and a common table identifier to uniquely identify the common table; and the common data item defining information includes a common table identifier to uniquely identify a data item of the common table for keeping data as an object of a data conversion.

7. A data conversion system according to claim 4, wherein:
the physical data format defining information further includes a physical table, the physical table being a table for keeping data as an object of a data conversion;
the common data format defining information further includes a common table, the common table being a table for keeping data as an object of a data conversion; and
a data conversion rule definition state between physical and common tables indicating whether or not a data conversion rule between the physical table and the common table is beforehand defined is displayed.

8. A data conversion method for converting data transferred between a first data processing system and a second data processing system, which systems operate cooperatively in a configuration of a complex system including a plurality of data processing systems, the method comprising:
accessing a first conversion rule table, the first conversion rule table storing a data format for each of the data processing systems, an intermediate data format which is a data representation format to be commonly used for all the data processing systems, and an input/output type for indicating a direction of conversion, so as to have a correspondence relationship therebetween;
determining a first data format conversion rule by using information identifying the first system, the first data conversion rule being a rule for converting first data into first intermediate data, the first data being expressed by a first data format which is a data expression format specific for the first system, the first data having a first meaning, the first intermediate data being expressed by an intermediate data format which is a data expression format, the first intermediate data having the first meaning of the first data but being in the intermediate data format;
determining a data meaning conversion rule by using identifier information of the data meaning conversion rule, the data meaning conversion rule being a rule for converting the first intermediate data into second intermediate data, the second intermediate data having a second meaning but being expressed in the same intermediate data format as the first intermediate data;
determining a second data format conversion rule by using information identifying the second system, the second data format conversion rule being a rule for converting the second intermediate data into second data, the second data being expressed by a second data format which is a data expression format specific for the second system, the second data having the second meaning, the data expression format specific for the second system being different from the data expression format specific for the first system;
converting the first data into the second data based on the determined first data format conversion rule, the determined data meaning conversion rule, and the determined second data format conversion rule;
outputting the converted second data for the second data processing system; and
enabling multiple users to concurrently update definitions used for any of the first data format conversion rule, the data meaning conversion rule, and the second data format conversion rule,
wherein, in each of the first data format conversion rule and the second data format conversion rule, data before conversion and data after conversion have identical meaning,
wherein the first data format conversion rule is a conversion rule of converting physical data into common data,
wherein the data meaning conversion rule is a conversion rule of converting common data into common data,
wherein the second data format conversion rule is a conversion rule of converting common data into physical data, and
wherein the first data format conversion rule, the data meaning conversion rule, and the second data format conversion rule are defined by referring to information of conversion rules between physical data and common data and information of conversion rules between common data and common data.

9. The data conversion method according to claim 8, wherein converting the first data into the second data includes:
converting the first data into the first intermediate data based on the determined first data format conversion rule;
converting the first intermediate data into the second intermediate data based on the determined data meaning conversion rule; and
converting the second intermediate data into the second data based on the determined second data format conversion rule.

10. The data conversion method according to claim 8, wherein converting the first data into the second data includes calculating a rule for converting the first data into the second data based on the first data format conversion rule, the data meaning conversion rule, and the determined second data format conversion rule.

11. The data conversion method according to claim 8, wherein the first data format conversion rule, data meaning conversion rule, and second data format conversion rule are defined by referring to physical data format defining information and common data format defining information.

12. The data conversion method according to claim 11, wherein:
the physical data format defining information includes physical table defining information and physical data item defining information;
the physical table defining information includes a physical table, the physical table being a table for keeping data as an object of a data conversion and a physical table identifier to uniquely identify the physical table; and
the physical data item defining information includes a physical table identifier to uniquely identify a data item of the physical table for keeping data as an object of a data conversion.

13. A data conversion method according to claim 8, wherein:
the common data format defining information includes common table defining information and common data item defining information;
the common table defining information includes a common table, the common table being a table for keeping data as an object of a data conversion and a common table identifier to uniquely identify the common table; and
the common data item defining information includes a common table identifier to uniquely identify a data item of the common table for keeping data as an object of a data conversion.

14. A computer program product embedded in a computer-readable storage medium for converting data transferred between a first data processing system and a second data processing system, which systems operate cooperatively in a configuration of a complex system including a plurality of data processing systems, the computer program product including instructions that, when executed by a processor, cause the processor to:

access a first conversion rule table, the first conversion rule table storing a data format for each of the data processing systems, an intermediate data format which is a data representation format to be commonly used for all the data processing systems, and an input/output type for indicating a direction of conversion, so as to have a correspondence relationship therebetween;

determine a first data format conversion rule using information identifying the first system, the first data conversion rule being a rule for converting first data into first intermediate data, the first data being expressed by a first data format which is a data expression format specific for the first system, the first data having a first meaning, the first intermediate data being expressed by an intermediate data format which is a data expression format, the first intermediate data having the first meaning of the first data but being in the intermediate data format;

determine a data meaning conversion rule using identifier information of the second conversion rule, the second conversion rule being a rule for converting the first intermediate data into second intermediate data, the second intermediate data having a second meaning but being expressed in the same intermediate data format as the first intermediate data;

determine a second data format conversion rule using information identifying the second system, the second data format conversion rule being a rule for converting the second intermediate data into second data, the second data being expressed by a second data format which is a data expression format specific for the second system, the second data having the second meaning, the data expression format specific for the second system being different from the data expression format specific for the first system;

convert the first data into the second data based on the determined first data format conversion rule, the determined data meaning conversion rule, and the determined second data format conversion rule;

output the converted second data for the second data processing system; and enable multiple users to concurrently update definitions used for any of the first data format conversion rule, the data meaning conversion rule, and the second data format conversion rule, wherein, in each of the first data format conversion rule and the second data format conversion rule, data before conversion and data after conversion have identical meaning, wherein the first data format conversion rule is a conversion rule of converting physical data into common data, wherein the data meaning conversion rule is a conversion rule of converting common data into common data, wherein the second data format conversion rule is a conversion rule of converting common data into physical data, and wherein the first data format conversion rule, the data meaning conversion rule, and the second data format conversion rule are defined by referring to information of conversion rules between physical data and common data and information of conversion rules between common data and common data.

15. The computer program product according to claim 14, wherein converting the first data into the second data includes calculating a rule for converting the first data into the second data based on the first data format conversion rule, the data meaning conversion rule and the determined second data format conversion rule.

* * * * *